United States Patent
Li et al.

(10) Patent No.: US 11,094,758 B1
(45) Date of Patent: Aug. 17, 2021

(54) ORGANIC LIGHT EMITTING DIODE (OLED) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Shasha Li, Hubei (CN); Yan Xie, Hubei (CN); Liang Sun, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 7 days.

(21) Appl. No.: 16/652,427

(22) PCT Filed: Mar. 17, 2020

(86) PCT No.: PCT/CN2020/079733
§ 371 (c)(1),
(2) Date: Mar. 31, 2020

(51) Int. Cl.
*H01L 27/32* (2006.01)
*H01L 51/52* (2006.01)

(52) U.S. Cl.
CPC ...... *H01L 27/3244* (2013.01); *H01L 51/5215* (2013.01); *H01L 51/5218* (2013.01); *H01L 27/3211* (2013.01); *H01L 27/3234* (2013.01)

(58) Field of Classification Search
CPC ............. H01L 27/3244; H01L 51/5215; H01L 51/5218; H01L 27/3211
See application file for complete search history.

(56) References Cited

U.S. PATENT DOCUMENTS

| | | |
|---|---|---|
| 2019/0213380 A1 | 7/2019 | Joo et al. |
| 2019/0372057 A1 | 12/2019 | Park et al. |
| 2020/0350375 A1 | 11/2020 | Zhu et al. |

FOREIGN PATENT DOCUMENTS

| | | |
|---|---|---|
| CN | 110061044 A | 7/2019 |
| CN | 110376794 A | 10/2019 |
| CN | 110544749 A | 12/2019 |
| CN | 110571252 A | 12/2019 |

*Primary Examiner* — Anthony Ho
(74) *Attorney, Agent, or Firm* — Mark M. Friedman

(57) ABSTRACT

The present application discloses an OLED display device including an OLED display panel. The OLED display panel has a first display area and a second display area disposed around the first display area, wherein a first pixel electrode layer in the first display area includes at least a two-layered indium tin oxide (ITO) conductive layer, and a second pixel electrode layer in the second display area is a three-layered ITO/Ag/ITO conductive layer.

10 Claims, 3 Drawing Sheets

ORGANIC LIGHT EMITTING DIODE (OLED) DISPLAY DEVICE

BACKGROUND OF INVENTION

Field of Invention

The present application relates to a field of display technology, and in particular, to an organic light emitting diode (OLED) display device.

Description of Prior Art

An organic light emitting diode (OLED) is a promising display product having advantages of thinness, lightness, wide viewing angles, active light emission, fast response times, low energy consumption, low driving voltage, wide operating temperature range, and high luminous efficiency, such that it have been favored by more and more panel manufacturers. At present, with the development of portable electronic display devices, full-screen display panels pursuing a high screen-to-body ratio and an ultra-narrow bezel have become hotspots of research and development in the field of small-sized and medium-sized display panels, and have been applied to mobile phone displays. At present, the advantage of a full-screen is that it can maximize use of the display area of the display panel screen and bring a better visual experience to a user.

However, in order to achieve full-screen display, sensors such as a fingerprint, a camera sensor and a recognition sensor are usually integrated under the screen. During manufacturing a full-screen, when a pixel electrode of the display area corresponding to the under-screen sensor adopts a three-layered ITO/Ag/ITO conductive layer, although it can achieve normal display, a silver layer existing in the pixel electrode will reduce the film transmission, thus impacting the sensor signal transmission, and further impacting the signal recognition of the under-screen sensor.

In summary, during manufacturing the full-screen of the existing OLED display device, since the pixel electrode in the display area corresponding to the under-screen sensor adopts a three-layered ITO/Ag/ITO conductive layer structure, the existence of the silver layer will reduce the film transmission, thus impacting the sensor signal transmission, and further impacting the signal recognition of the under-screen sensor.

In the existing OLED display device, since the pixel electrode in the display area corresponding to the under-screen sensor adopts a three-layered ITO/Ag/ITO conductive layer structure, the existence of the silver layer will reduce the film transmission, thus impacting the sensor signal transmission, and further impacting the signal recognition of the under-screen sensor.

SUMMARY OF INVENTION

An embodiment of the present application provides an OLED display device, which can further enhance the transmittance of the layer corresponding to the under-screen sensor to solve the technical problems of the existing OLED display device that since the pixel electrode in the display area corresponding to the under-screen sensor adopts a three-layered ITO/Ag/ITO conductive layer structure, the existence of the silver layer will reduce the film transmission, thus impacting the sensor signal transmission, and further impacting the signal recognition of the under-screen sensor.

In a first aspect, an embodiment of the present application provides organic light-emitting diode (OLED) display device, including an OLED display panel having a first display area and a second display area disposed around the first display area, wherein a first pixel electrode layer in the first display area includes at least a two-layered indium tin oxide (ITO) conductive layer, and a second pixel electrode layer in the second display area is a three-layered ITO/Ag/ITO conductive layer.

In the OLED display device provided by an embodiment of the present application, an under-screen sensor is correspondingly disposed below a portion of the OLED display panel in the first display area.

In the OLED display device provided by an embodiment of the present application, the first pixel electrode layer includes the two-layered ITO conductive layer and the three-layered ITO/Ag/ITO conductive layer.

In the OLED display device provided by an embodiment of the present application, in the first pixel electrode layer, a number of pixels corresponding to the two-layered ITO conductive layer is 0.5 times a number of pixels corresponding to the three-layered ITO/Ag/ITO conductive layer.

In the OLED display device provided by an embodiment of the present application, in the first pixel electrode layer, a number of pixels corresponding to the two-layered ITO conductive layer is 2 times a number of the pixels corresponding to the three-layered ITO/Ag/ITO conductive layer.

In the OLED display device provided by an embodiment of the present application, the first pixel electrode layer is entirely made of the two-layered ITO conductive layer.

In the OLED display device provided by an embodiment of the present application, except that the first pixel electrode layer and the second pixel electrode layer are made of different materials, other layers disposed in the first display area and other layers disposed in the second display area are made of same materials.

In the OLED display device provided by an embodiment of the present application, the first display area includes an under-screen sensing layer, a substrate, a thin film transistor layer stacked on the substrate, a planarization layer on a the thin film transistor layer, the first pixel electrode layer disposed on the planarization layer, a pixel definition layer disposed on the first pixel electrode layer and covering a part of the planarization layer, an OLED device layer disposed in a pixel opening area of the pixel definition layer, and a thin film encapsulation layer disposed on the pixel definition layer and the OLED device layer, which are stacked from bottom to top sequentially.

In the OLED display device provided by an embodiment of the present application, the thin film transistor layer includes a buffer layer, an active layer, a gate insulating layer, a gate metal layer, an interlayer insulating layer, and a source/drain metal layer, which are stacked from bottom to top sequentially.

In the OLED display device provided by an embodiment of the present application, the under-screen sensor includes an under-screen camera sensor or an under-screen fingerprint recognition sensor.

Compared with the prior art, the OLED display device provided in an embodiment of the present application designs a pixel electrode in the display area corresponding to the under-screen sensor to have a two-layered ITO conductive layer, which enhances the film transmittance of the display area corresponding to the under-screen sensor, thereby realizing full-screen display of the OLED display device.

DETAILED DESCRIPTION OF PREFERRED EMBODIMENTS

Figure 1:
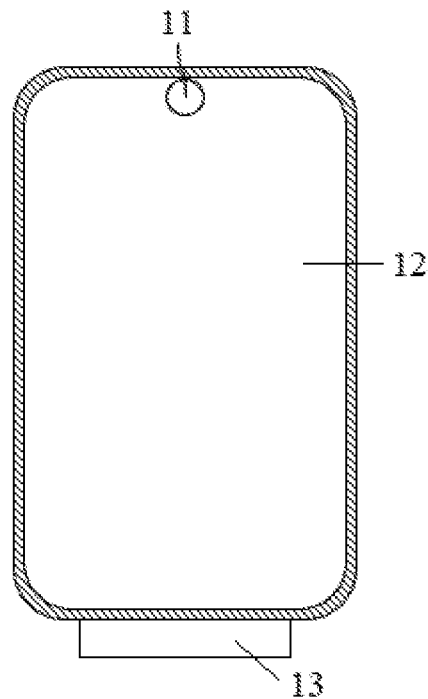
FIG. 1 is a schematic plan view of an OLED display device according to an embodiment of the present application.

As shown in FIG. 1, FIG. 1 is a schematic plan view of an OLED display device according to an embodiment of the present application. The OLED display device includes an OLED display panel and an under-screen sensor disposed under the OLED display panel. The OLED display panel includes a first display area 11 corresponding to the under-screen sensor and a second display area 12 surrounding the first display area 11 and covering the OLED display panel. A driving chip 13 is further connected to a lower frame of the OLED display panel. The OLED display device provided in an embodiment of the present application is provided with a first display area 11 corresponding to the under-screen sensor and a second display area 12 surrounding the first display area 11 and covering the OLED display panel. The OLED display panel is applied to a mobile phone to achieve a full-screen display and bring a better visual experience to an user.

Figure 2:
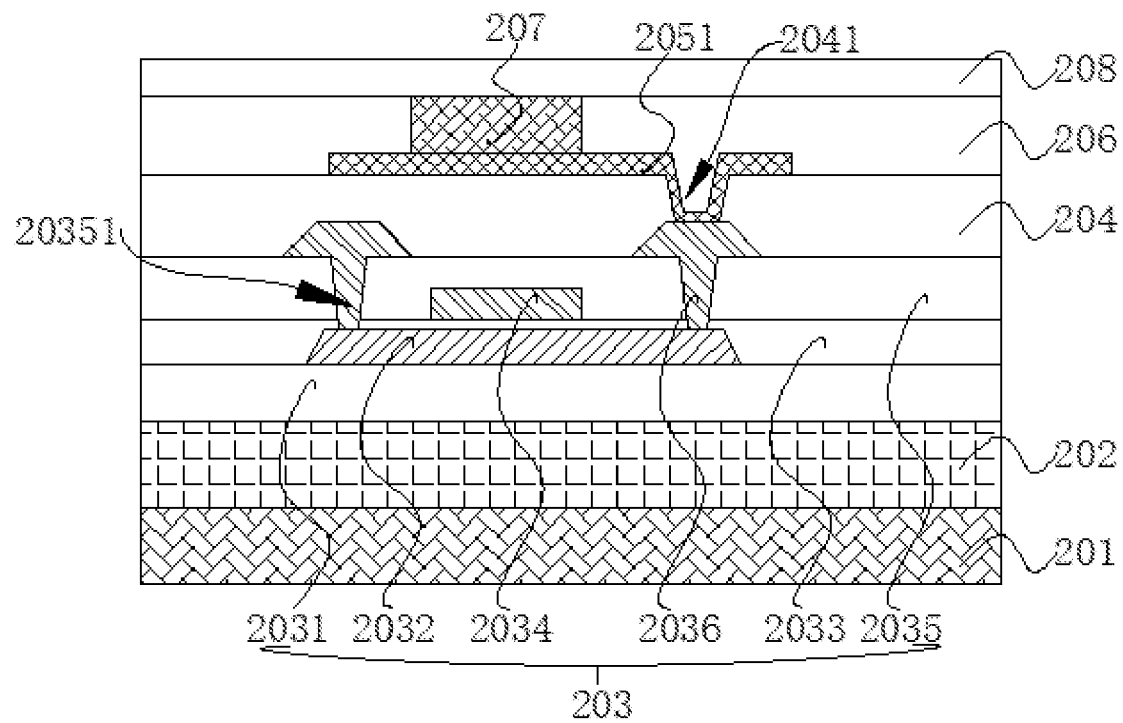
FIG. 2 is a schematic cross-sectional structure diagram of an OLED display device in a first display area according to an embodiment of the present application.

As shown in FIG. 2, FIG. 2 is a schematic cross-sectional structure diagram of an OLED display device in a first display area according to an embodiment of the present application. The first display area includes an under-screen sensing layer 201, a substrate 202, a thin film transistor layer 203, a planarization layer 204, a first pixel electrode layer 2051, a pixel definition layer 206, an OLED device layer 207, and a thin film encapsulation layer 208 that are stacked from bottom to top sequentially.

Specifically, the under-screen sensing layer 201 is located below the substrate 202, and the under-screen sensing layer 201 is provided with an under-screen sensor, wherein the under-screen sensor includes an under-screen camera sensor or an under-screen fingerprint recognition sensor.

Specifically, the substrate 202 is preferably made of glass or other organic flexible materials.

Specifically, the thin film transistor layer 203 is disposed on the substrate 202, and includes a buffer layer 2031, an active layer 2032, a gate insulating layer 2033, and a gate metal layer 2034, an interlayer insulating layer 2035, and a source/drain metal layer 2036 which are stacked from bottom to top sequentially. The source/drain metal layer 2036 is connected to opposite ends of the active layer 2032 through a first via hole 20351 on the interlayer insulating layer 2035. Preferably, the buffer layer 2031 is mainly made of an inorganic material such as silicon nitride or silicon oxide; the active layer 2032 is made of polysilicon or doped polysilicon; and the gate metal layer 2034 is mainly made of a metal having a low resistivity, such as copper or molybdenum; the interlayer insulating layer 2035 is mainly made of made of an inorganic material such as silicon nitride or silicon oxide; and the source/drain metal layer 2036 is generally made of a metal having a low resistivity, such as copper or molybdenum.

Specifically, the planarization layer 204 is disposed on the interlayer insulating layer 2035 and completely covers the source/drain metal layer 2036. The material of the planarization layer 204 is preferably an organic photoresist.

Specifically, the first pixel electrode layer 2051 is disposed on the planarization layer 204. The planarization layer 204 is provided with a second via hole 2041, and the first pixel electrode layer 2051 is connected to the source/drain metal layer 2036 through the second via hole 2041. The first pixel electrode layer 2051 includes at least a two-layered indium tin oxide (ITO) conductive layer.

Specifically, the pixel definition layer 206 is disposed on the planarization layer 204 and completely covers the first pixel electrode layer 2051. The pixel definition layer 206 has an opening area. The pixel definition layer 206 is mainly made of an organic material, and preferably an organic photoresist.

Specifically, the OLED device layer 207 is located in the opening area defined by the pixel definition layer 206. The OLED device layer 207 includes an organic light-emitting layer and a cathode metal layer.

Specifically, the thin film encapsulation layer 208 completely covers the pixel definition layer 206 and the OLED device layer 207. The thin film encapsulation layer 208 is mainly made of nitrogen oxide and an organic encapsulation material. The thin film encapsulation layer 208 is configured to prevent outside water and oxygen from invading the OLED device layer 207 and resulting in failure of the OLED display device.

Figure 3:
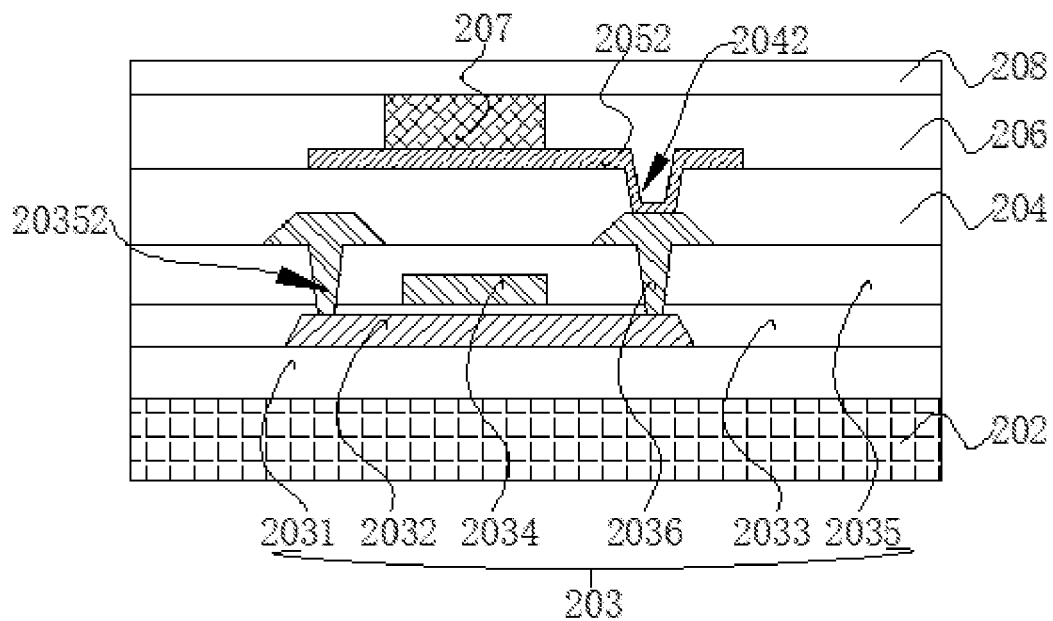
FIG. 3 is a schematic cross-sectional structure diagram of an OLED display device in a second display area according to an embodiment of the present application.

As shown in FIG. 3, FIG. 3 is a schematic cross-sectional structure diagram of an OLED display device in a second display area according to an embodiment of the present application. The second display area includes the substrate 202, the thin film transistor layer 203, the planarization layer 204, the second pixel electrode layer 2052, the pixel definition layer 206, the OLED device layer 207, and the thin film encapsulation layer 208, which are stacked from bottom to top sequentially.

Specifically, the substrate 202 is preferably made of a glass or other organic flexible materials.

Specifically, the thin film transistor layer 203 is disposed on the substrate 202, and includes a buffer layer 2031, an active layer 2032, a gate insulating layer 2033, and a gate metal layer 2034, an interlayer insulating layer 2035, and a source/drain metal layer 2036 which are stacked from bottom to top sequentially. The source/drain metal layer 2036 is connected to opposite ends of the active layer 2032 through a first via hole 20351 on the interlayer insulating layer 2035. Preferably, the buffer layer 2031 is mainly made of an inorganic material such as nitrogen silicide or silicon oxide; the active layer 2032 is made of polysilicon or doped polysilicon; and the gate metal layer 2034 is mainly made of a metal having a low resistivity, such as copper or molybdenum; the interlayer insulating layer 2035 is mainly made of made of an inorganic material such as nitrogen silicide or silicon oxide; and the source/drain metal layer 2036 is generally made of a metal having a low resistivity, such as copper or molybdenum.

Specifically, the planarization layer 204 is disposed on the interlayer insulating layer 2035 and completely covers the source/drain metal layer 2036. The material of the planarization layer 204 is preferably an organic photoresist.

Specifically, the second pixel electrode layer 2052 is disposed on the planarization layer 204. The planarization layer 204 is provided with a second via hole 2041, and the second pixel electrode layer 2052 is connected to the source/drain metal layer 2036 through the fourth via hole 2042. The second pixel electrode layer 2052 is a three-layer ITO/Ag/ITO conductive layer, wherein Ag is used as a reflection layer to reflect light emitted by the OLED device layer 207 to a light output direction, improving light output efficiency.

Specifically, the pixel definition layer 206 is disposed on the planarization layer 204 and completely covers the first pixel electrode layer 2051. The pixel definition layer 206 has an opening area. The pixel definition layer 206 is mainly made of an organic material, and preferably an organic photoresist.

Specifically, the OLED device layer 207 is located in the opening area defined by the pixel definition layer 206. The OLED device layer 207 includes an organic light-emitting layer and a cathode metal layer.

Specifically, the thin film encapsulation layer 208 completely covers the pixel definition layer 206 and the OLED device layer 207. The thin film encapsulation layer 208 is mainly made of nitrogen oxide and an organic encapsulation material. The thin film encapsulation layer 208 is configured to prevent outside water and oxygen from invading the OLED device layer 207 resulting in failure of the OLED display device.

Figure 4:
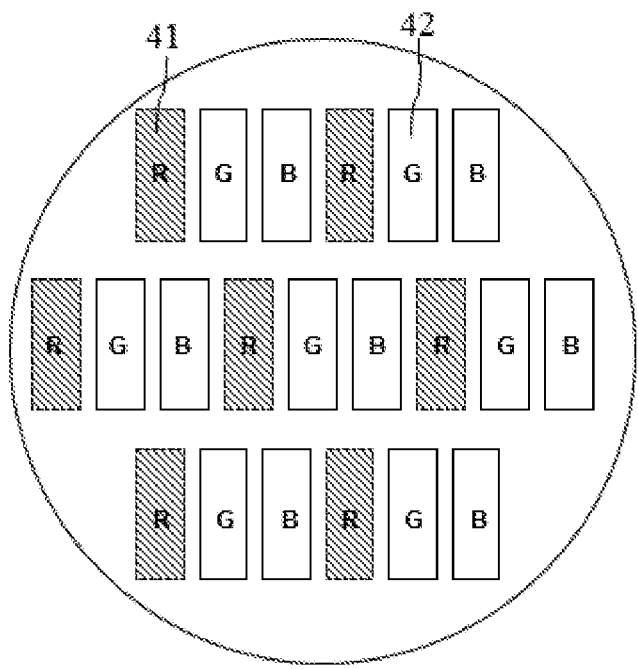
FIG. 4 is a schematic plan view of a pixel design in a first display area of an OLED display device according to a first embodiment of the present application.

As shown in FIG. 4, FIG. 4 is a schematic plan view of a pixel design in a first display area of an OLED display device according to a first embodiment of the present application. The first pixel electrode layer located in the first display area according to the first embodiment of the OLED display device includes the two-layered ITO conductive layer and the three-layered ITO/Ag/ITO conductive layer.

Specifically, the pixels of the OLED display device in the first display area according to the first embodiment include a first-type pixel 41 and second-type pixels 42. The first-type pixel 41 is any one of a red sub-pixel, a green sub-pixel, and a blue sub-pixel, and the second-type pixels 42 are a remaining pixels other than the first-type pixel 41.

Specifically, the first-type pixel 41 is composed of a two-layered ITO conductive layer, and the second-type pixel 42 is composed of a three-layered ITO/Ag/ITO conductive layer. A number of the first-type pixels 41 is 0.5 times a number of the second-type pixels 42.

Figure 5:
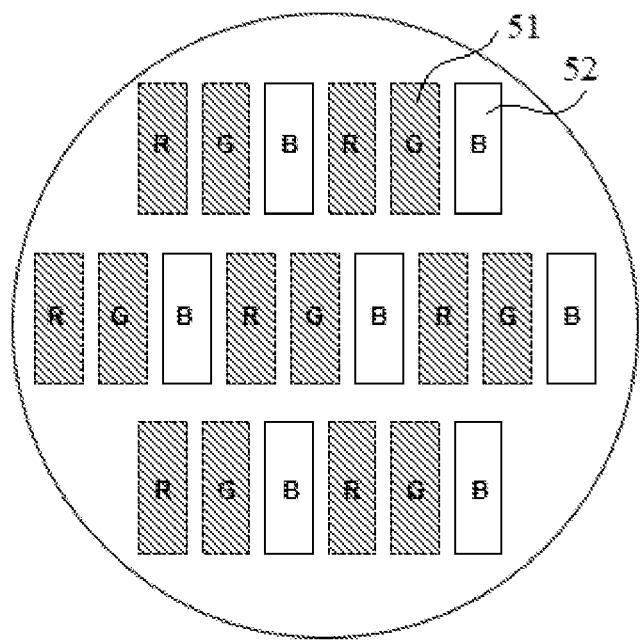
FIG. 5 is a schematic plan view of a pixel design in a first display area of an OLED display device according to a second embodiment of the present application.

As shown in FIG. 5, FIG. 5 is a schematic plan view of a pixel design in a first display area of an OLED display device according to a second embodiment of the present application. The first pixel electrode layer of the OLED display device in the first display area according to the second embodiment includes the two-layered ITO conductive layer and the three-layered ITO/Ag/ITO conductive layer.

Specifically, the pixels in the first display area in the second embodiment of the OLED display device include first-type pixels 51 and a second-type pixel 52. The first-type pixels 51 are any two of a red sub-pixel, a green sub-pixel, and a blue sub-pixel, and the second-type pixel 52 is a remaining pixel other than the first-type pixels 51.

Specifically, the first-type pixel 51 is composed of a two-layered ITO conductive layer, and the second-type pixel 52 is composed of a three-layered ITO/ITO conductive layer. A number of the first-type pixels 51 is 2 times a number of the second-type pixels 52.

Figure 6:
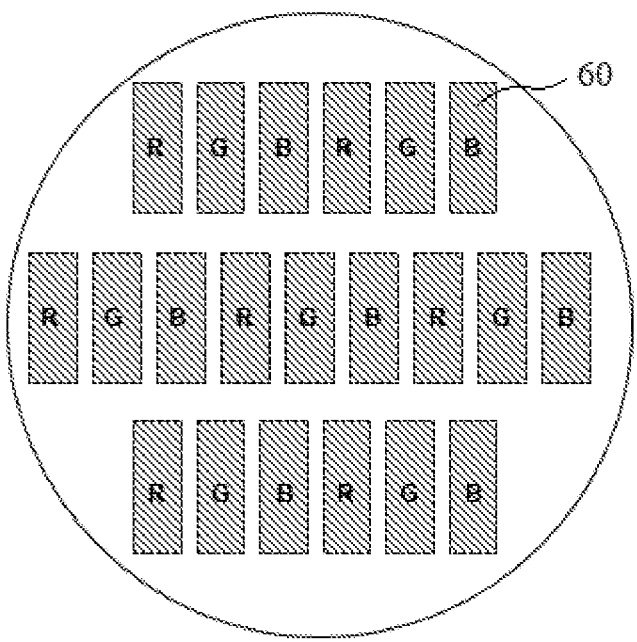
FIG. 6 is a schematic plan view of a pixel design in a first display area of an OLED display device according to a third embodiment of the present application.

As shown in FIG. 6, FIG. 6 is a schematic plan view of a pixel design in a first display area of an OLED display device according to a third embodiment of the present application. The first pixel electrode layer of the OLED display device in the first display area is the two-layered ITO conductive layer. Specifically, the pixel electrode of the pixel 60 of the OLED display device in the first display area according to the third embodiment is entirely composed of the two-layered ITO conductive layer.

The OLED display device provided in an embodiment of the present application designs at least a part of the pixel electrodes in the display area corresponding to the under-screen sensor to have a two-layered ITO conductive layer structure. On the one hand, the display area corresponding to the under-screen sensor can realize full-screen display. On the other hand, the adopted two-layered ITO conductive layer structure provides the film with better transmission, improves the signal-to-noise ratio, and is more conducive to signal transmission.

Specific implementation of the foregoing operations can be referred to the foregoing embodiments, and details are not repeated herein for brevity.

In summary, the OLED display device provided in an embodiment of the present application designs a pixel electrode in the display area corresponding to the under-screen sensor to have a two-layered ITO conductive layer, which enhances the film transmittance of the display area corresponding to the under-screen sensor, thereby realizing full-screen display of the OLED display device.

It can be understood that for a person of ordinary skill in the art, equivalent replacements or changes can be made according to the technical solution of the present application and its inventive concept, and all these changes or replacements should fall within the protection scope of the claims attached to this application.

What is claimed is:

1. An organic light-emitting diode (OLED) display device, comprising an OLED display panel having a first display area and a second display area disposed around the first display area, wherein a first pixel electrode layer in the first display area comprises at least a two-layered indium tin oxide (ITO) conductive layer, and a second pixel electrode layer in the second display area is a three-layered ITO/Ag/ITO conductive layer.

2. The OLED display device according to claim 1, wherein an under-screen sensor is correspondingly disposed below a portion of the OLED display panel in the first display area.

3. The OLED display device according to claim 2, wherein the first pixel electrode layer comprises the two-layered ITO conductive layer and the three-layered ITO/Ag/ITO conductive layer.

4. The OLED display device according to claim 3, wherein in the first pixel electrode layer, a number of pixels corresponding to the two-layered ITO conductive layer is 0.5 times a number of pixels corresponding to the three-layered ITO/Ag/ITO conductive layer.

5. The OLED display device according to claim 3, wherein in the first pixel electrode layer, a number of pixels corresponding to the two-layered ITO conductive layer is 2 times a number of the pixels corresponding to the three-layered ITO/Ag/ITO conductive layer.

6. The OLED display device according to claim 2, wherein the first pixel electrode layer is entirely composed of the two-layered ITO conductive layer.

7. The OLED display device according to claim 2, wherein except that the first pixel electrode layer and the second pixel electrode layer are made of different materials, other layers disposed in the first display area and other layers disposed in the second display area are made of same materials.

8. The OLED display device according to claim 7, wherein the first display area comprises an under-screen sensing layer, a substrate, a thin film transistor layer stacked on the substrate, a planarization layer on the thin film transistor layer, the first pixel electrode layer disposed on the planarization layer, a pixel definition layer disposed on the first pixel electrode layer and covering a part of the planarization layer, an OLED device layer disposed in a pixel opening area of the pixel definition layer, and a thin film encapsulation layer disposed on the pixel definition layer and the OLED device layer, which are stacked from bottom to top sequentially.

9. The OLED display device according to claim 8, wherein the thin film transistor layer comprises a buffer layer, an active layer, a gate insulating layer, a gate metal layer, an interlayer insulating layer, and a source/drain metal layer, which are stacked from bottom to top sequentially.

10. The OLED display device according to claim 2, wherein the under-screen sensor comprises an under-screen camera sensor or an under-screen fingerprint recognition sensor.

* * * * *

UNITED STATES PATENT AND TRADEMARK OFFICE
CERTIFICATE OF CORRECTION

| | | |
|---|---|---|
| PATENT NO. | : 11,094,758 B1 | |
| APPLICATION NO. | : 16/652427 | |
| DATED | : August 17, 2021 | |
| INVENTOR(S) | : Shasha Li | |

It is certified that error appears in the above-identified patent and that said Letters Patent is hereby corrected as shown below:

On the Title Page

Item (30) should be added as follows:
Foreign Application Priority Data
Feb. 07, 2020 (CN)................................. 202010082661.9

Signed and Sealed this
Sixth Day of September, 2022

*Katherine Kelly Vidal*

Katherine Kelly Vidal
*Director of the United States Patent and Trademark Office*